United States Patent
Gereige et al.

(10) Patent No.: US 10,951,160 B2
(45) Date of Patent: Mar. 16, 2021

(54) APPARATUS FOR INCREASING ENERGY YIELD IN BIFACIAL PHOTOVOLTAIC MODULES

(71) Applicant: Saudi Arabian Oil Company, Dhahran (SA)

(72) Inventors: Issam Gereige, Thuwal (SA); Ahmed Al Saggaf, Thuwal (SA)

(73) Assignee: Saudi Arabian Oil Company, Dhahran (SA)

(*) Notice: Subject to any disclaimer, the term of this patent is extended or adjusted under 35 U.S.C. 154(b) by 263 days.

(21) Appl. No.: 15/826,152

(22) Filed: Nov. 29, 2017

(65) Prior Publication Data

US 2019/0165723 A1 May 30, 2019

(51) Int. Cl.
*H02S 40/22* (2014.01)
*H01L 31/042* (2014.01)

(52) U.S. Cl.
CPC ............ *H02S 40/22* (2014.12); *H01L 31/042* (2013.01)

(58) Field of Classification Search
CPC ........ Y02E 10/52; H02S 40/22; H01L 31/054
See application file for complete search history.

(56) References Cited

U.S. PATENT DOCUMENTS

| 5,538,563 A | 7/1996 | Finkl |
| 9,105,784 B2 | 8/2015 | Ishiguro |
| 2009/0120486 A1 | 5/2009 | Buller |
| 2010/0038507 A1 | 2/2010 | Schwarze et al. |
| 2011/0180134 A1* | 7/2011 | Kim ..................... H01L 31/0465 136/256 |
| 2012/0138123 A1 | 6/2012 | Newdoll et al. |
| 2013/0312811 A1 | 11/2013 | Aspnes et al. |
| 2016/0141437 A1* | 5/2016 | Asbeck ................. H01L 31/056 136/246 |

FOREIGN PATENT DOCUMENTS

| DE | 102010048730 A1 * | 12/2011 | ............ H02S 40/22 |
| KR | 101762795 B1 | 7/2017 | |

OTHER PUBLICATIONS

Machine translation of DE-102010048730-A1, Meisner Hans-Georg. (Year: 2011).*
Ooshaksaraei, P. et al., "Characterization of a Bifacial Photovoltaic Panel Integrated with External Diffuse and Semimirror Type Reflectors," International Journal of Photoenergy, vol. 2013, Article ID 465837, p. 1-8. 2013.

* cited by examiner

*Primary Examiner* — Mayla Gonzalez Ramos
(74) *Attorney, Agent, or Firm* — Leason Ellis LLP

(57) ABSTRACT

A system for generating electricity from solar energy comprises a first vertically-oriented bifacial photovoltaic module, a second vertically-oriented bifacial photovoltaic module positioned a horizontal distance form the first bifacial photovoltaic module, and a macro-textured structure positioned between the first and second bifacial photovoltaic modules. The macro-textured structure includes a plurality of protruding features having reflective surfaces, and the protruding features are operative to reflect light incoming within a range of 0 to 10 degree of vertical toward the first and second bifacial photovoltaic modules.

15 Claims, 5 Drawing Sheets

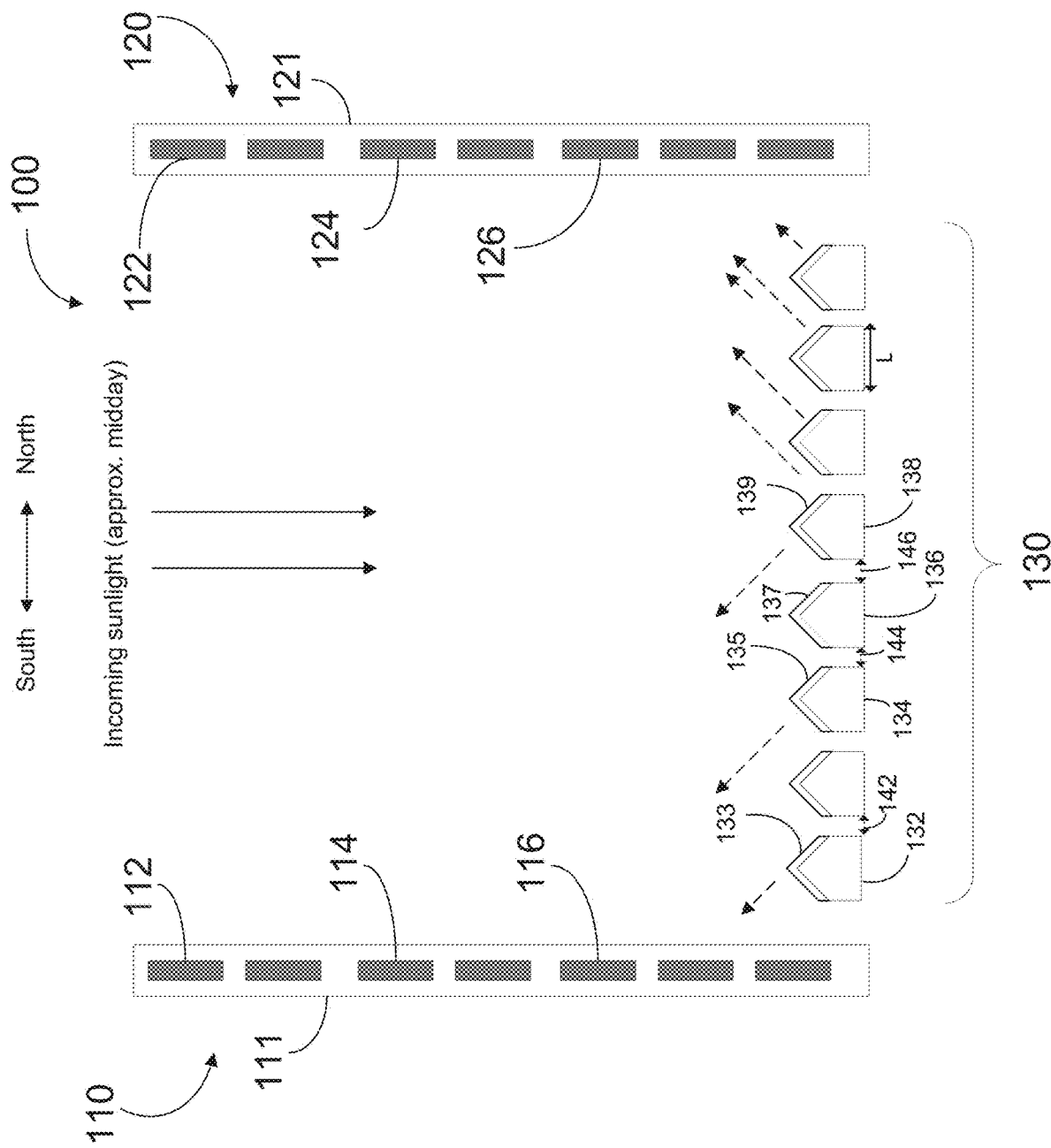

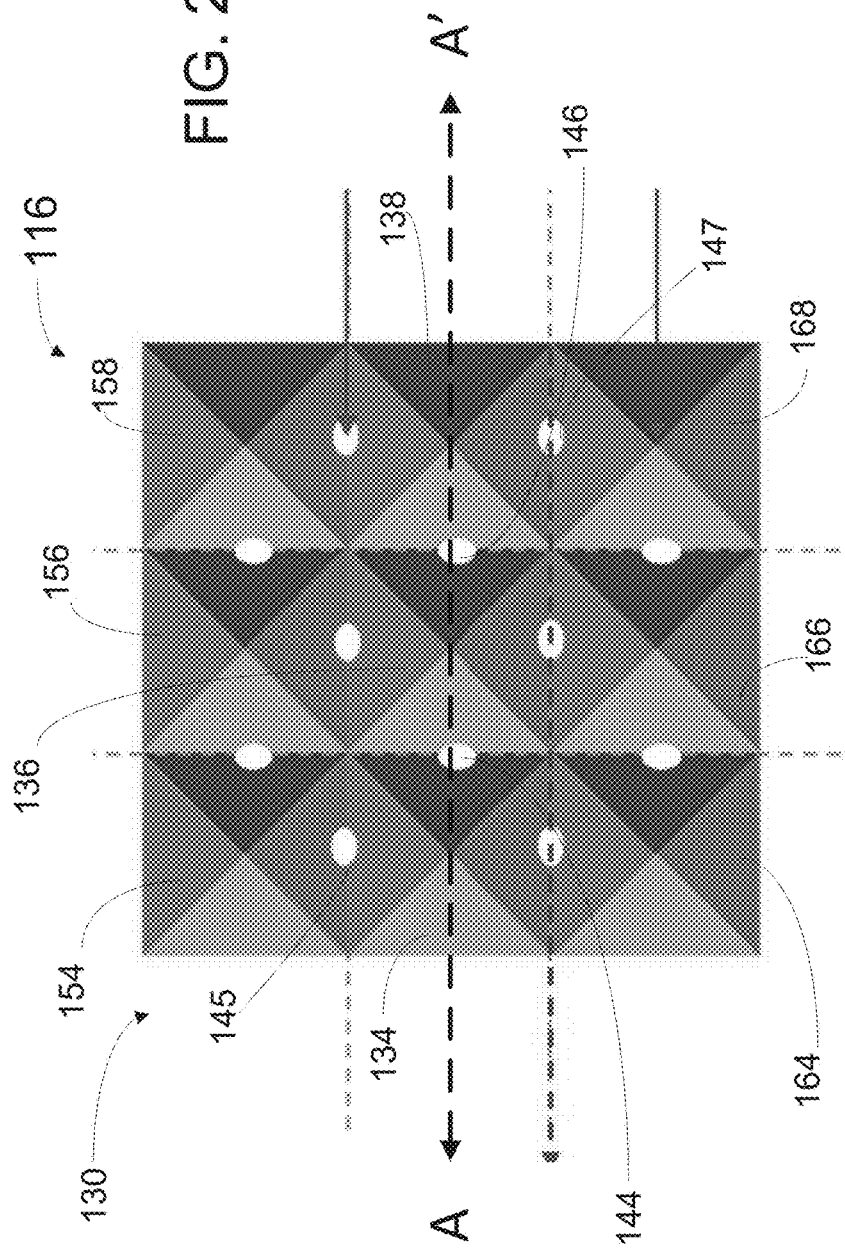
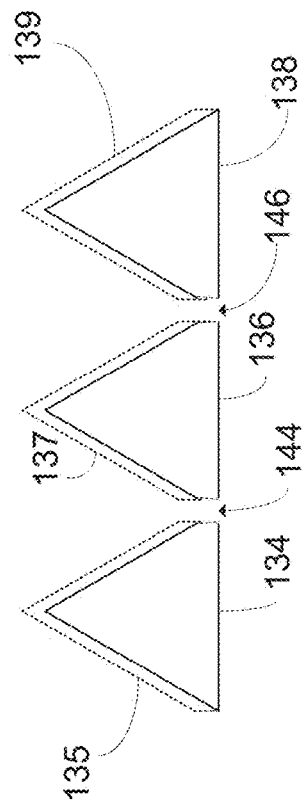

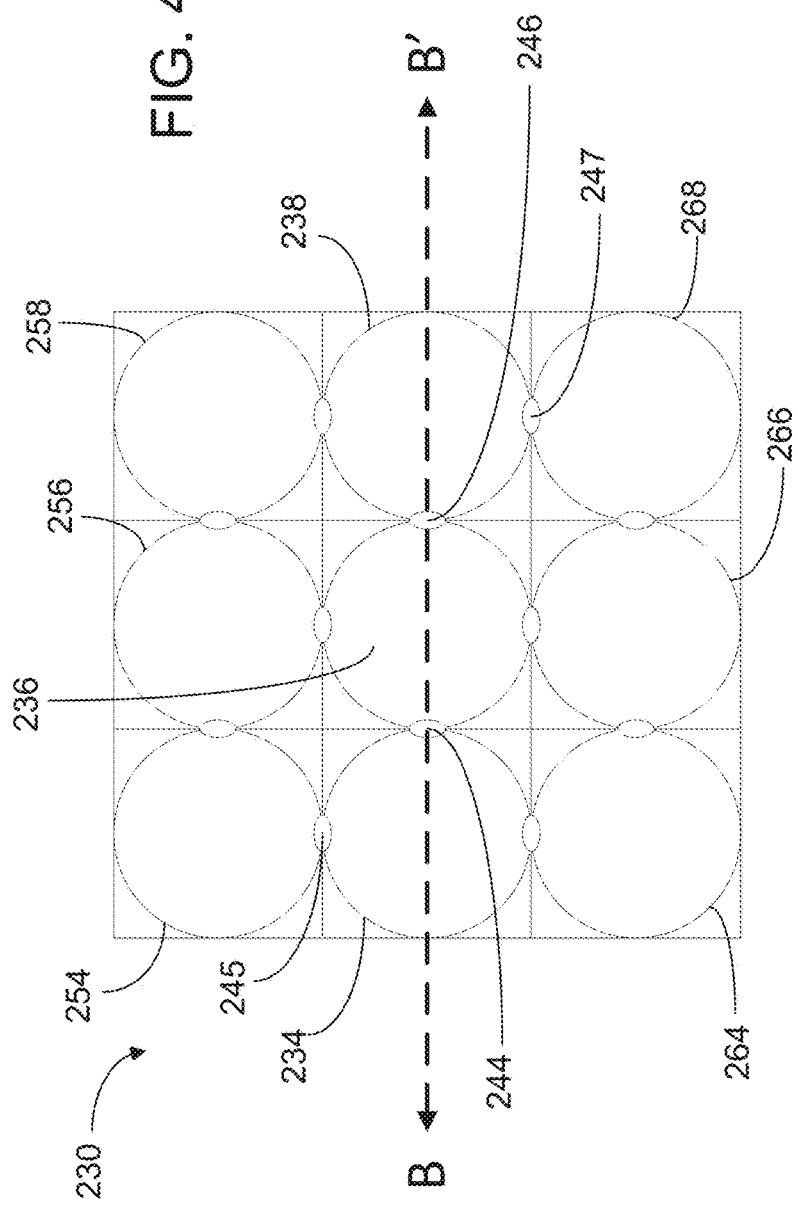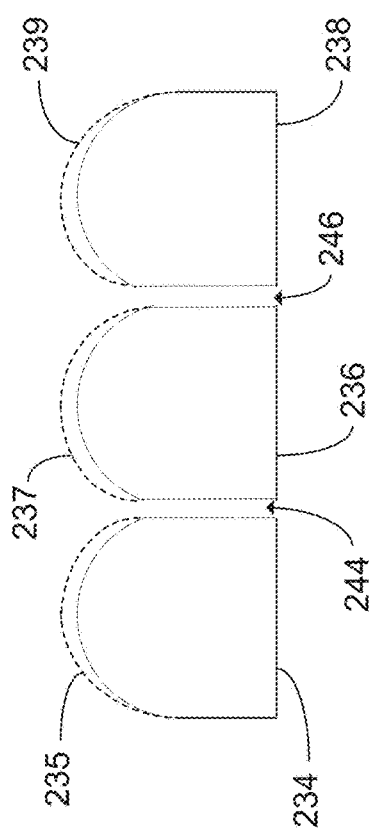

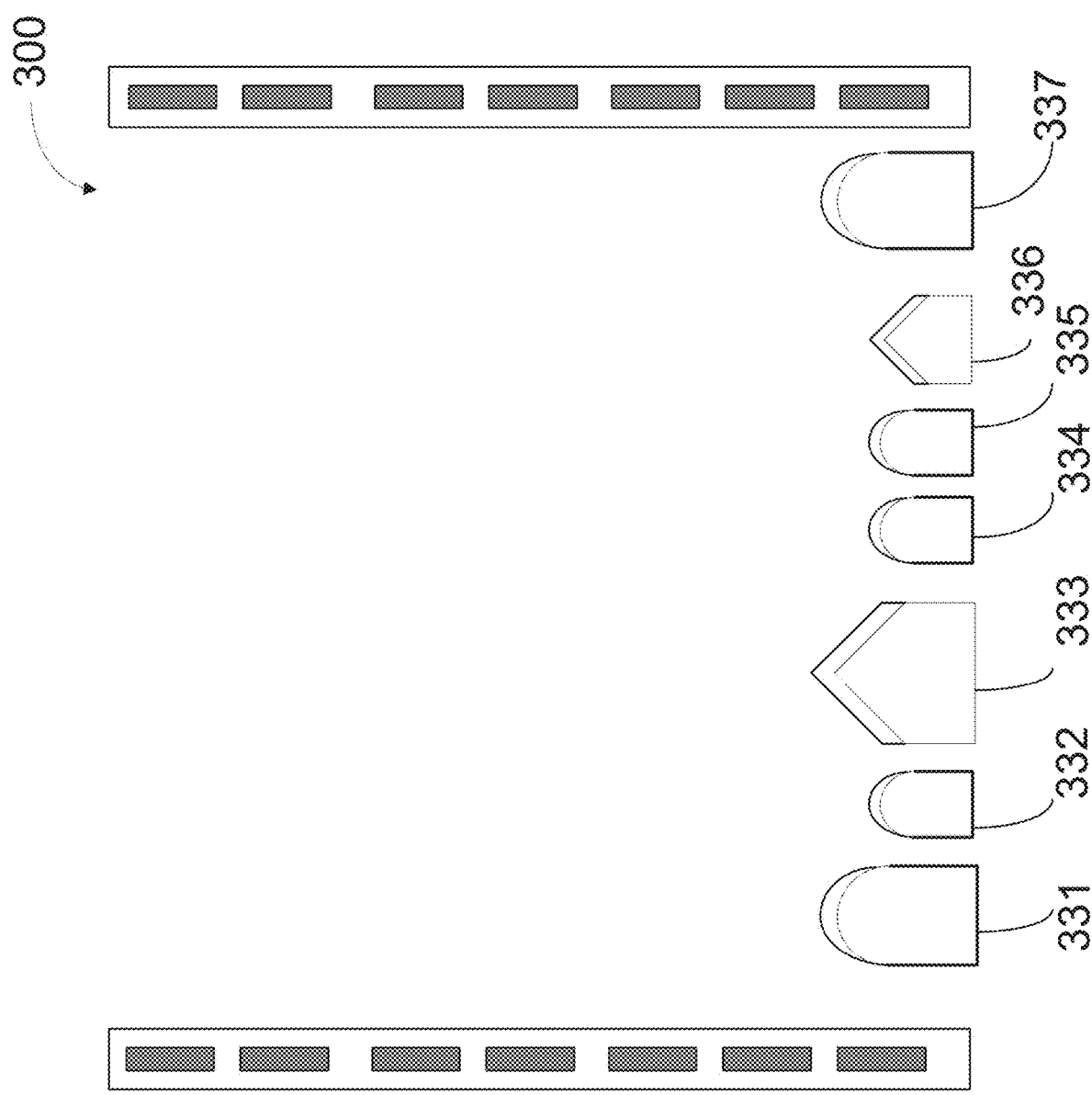

APPARATUS FOR INCREASING ENERGY YIELD IN BIFACIAL PHOTOVOLTAIC MODULES

FIELD OF THE INVENTION

The present invention relates generally to solar energy capture using photovoltaic cell modules, and in particular, relates to a textured apparatus that can be used to maximize energy yield in vertically-mounted bifacial photovoltaic modules.

BACKGROUND OF THE INVENTION

Bifacial solar (PV) modules are panels that include photovoltaic cells on both planar faces. In many applications, bifacial PV modules are mounted in a vertical alignment that is helpful for reducing dust accumulation. Obliquely-mounted, i.e., non-vertical, panels tend to dramatically decrease in energy yield over time due to dust accumulation unless they are regularly cleaned. Due to this advantage, vertically-mounted bifacial PV modules are particularly promising candidates for power generation in desert-like environments in which the concentration of aerosols is high for a significant portion of the year and because they are subject to high rates of dust accumulation.

A drawback of installing bifacial PV modules in a vertical configuration is that they tend to receive less sunlight during the middle of the day when the solar radiation is parallel or near parallel to the surfaces of the modules.

It would therefore be advantageous to remedy, mitigate, or at least ameliorate the midday power loss associated with vertically-mounted bifacial modules, so that the benefits of the vertical configuration in terms of reduced dust accumulation can be realized without suffering undue midday losses. It would be a further benefit to remedy, mitigate, or ameliorate power loss associated with vertically-mounted bifacial modules in a way in which cleaning operations are not impeded or complicated. The present invention addresses one or more of these and other problems in the art.

SUMMARY OF THE INVENTION

Embodiments of the present invention provide a system for generating electricity from solar energy that comprises a first vertically-oriented bifacial photovoltaic module, a second vertically-oriented bifacial photovoltaic module positioned a horizontal distance form the first bifacial photovoltaic module, and a macro-textured structure positioned between the first and second bifacial photovoltaic modules, the macro-textured structure having surface including a plurality of protruding features having reflective surfaces. The protruding features are operative to reflect light incoming within a range of 0 to 10 degree of vertical toward the first and second bifacial photovoltaic modules.

In some embodiments, a plurality of drainage holes positioned between adjacent protruding features on the macro-textured surface, the drainage holes adapted to remove dust and moisture from the macro-textured structure. In some implementations, the plurality of protruding features of the macro-textured structure is covered with a reflective coating layer.

In some embodiments, the plurality of protruding features is pyramidal in shape. In other embodiments, the plurality of protruding features is dome-shaped. Alternatively, the plurality of protruding features can have a variety of shapes. The plurality of protruding features can form a regular, periodic pattern on the surface of the macro-textured structure.

Embodiments of the present invention also provide an apparatus for improving the midday energy yield of a solar energy facility including a series of vertically-oriented bifacial photovoltaic modules. The apparatus comprises a macro-textured structure adapted to be positioned between adjacent module of a the series of bifacial photovoltaic modules, the macro-textured structure having surface including a plurality of protruding features having reflective surfaces that are operative to reflect light incoming within a range of 0 to 10 degree of vertical toward the first and second bifacial photovoltaic modules. The apparatus further includes a plurality of drainage holes positioned between adjacent protruding features on the macro-textured surface that are adapted to remove dust and moisture from the macro-textured structure. In some embodiments, the plurality of protruding features of the macro-textured structure is covered with a reflective coating layer.

In some embodiments, the plurality of protruding features of the apparatus is pyramidal in shape. In other embodiments the plurality of protruding features of the apparatus are dome-shaped. Alternatively, the plurality of protruding features of the apparatus can have a variety of shapes.

Additionally, in some implementations, the plurality of protruding features form a regular, periodic pattern on the surface of the macro-textured structure. In other implementations, the plurality of protruding features form a non-periodic pattern on the surface of the macro-textured structure.

These and other features can be appreciated from the accompanying description of certain embodiments of the invention which are discussed in relation to the accompanying drawing figures.

BRIEF DESCRIPTION OF THE DRAWINGS

FIG. 1 is a cross-sectional view of a vertically-mounted bifacial PV module system including a macro-textured structure according to an embodiment of the present invention.

FIG. 2A is a top view of a section of a macro-textured structure according to an embodiment of the present invention.

FIG. 2B is a cross-sectional view taken along line A-A' of FIG. 2A.

FIG. 4A is a top view of a section of a macro-textured structure of the embodiment shown in FIG. 3.

FIG. 4B is a cross-sectional view taken along line B-B' of FIG. 4A.

FIG. 5 is a cross-sectional view of another embodiment of a vertically-mounted bifacial PV module system including a macro-textured structure according to the present invention.

DETAILED DESCRIPTION CERTAIN OF EMBODIMENTS OF THE INVENTION

Figure 3:
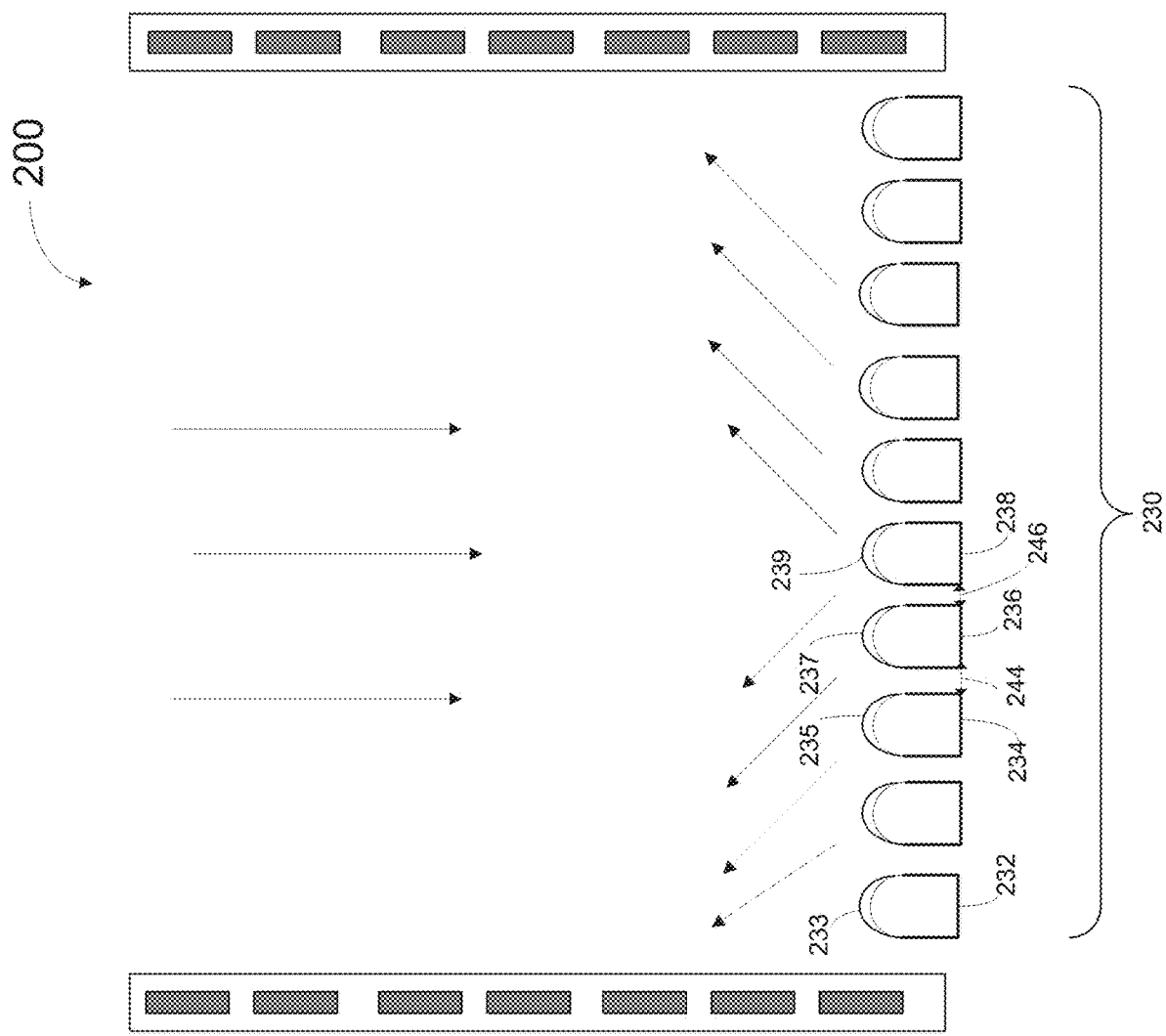
FIG. 3 is a cross-sectional view of another embodiment of a vertically-mounted bifacial PV module system including a macro-textured structure according to the present invention.

By way of overview, to increase the amount of solar radiation received by vertically-mounted bifacial PV modules, a macro-textured structure is positioned between adjacent bifacial modules to redirect incoming radiation toward the PV modules. The macro-textured structure reflects and/or scatters solar radiation that is incident at an angle ranging between 0° and 10° degrees of vertical (referred to herein as "vertical radiation") at various angles, enabling a substantial portion of the incident radiation to be redirected toward and received by photovoltaic elements of the bifacial PV modules.

FIG. 1 is a cross-sectional view of a solar electricity generation system 100 according to an embodiment of the present invention. The system 100 includes vertically-mounted bifacial PV panel modules 110, 120 that are positioned a distance apart from each other horizontally. It is to be appreciated that while two modules 110, 120 are shown, system 100 may include a larger number of such modules in an electricity-generation installation. First bifacial PV module 110 includes a planar covering 111 that is transparent to light in the visible spectrum. Covering 111 can be made of glass acrylic, polycarbonate or any other suitable robust transparent materials known in the art. The covering 111 encloses a plurality of photovoltaic elements, e.g., 112, 114, 116 arranged along the module that generate electrical current when exposed to solar radiation. In the embodiment depicted, first bifacial PV module 110 is positioned and oriented such that the normal to the surface of covering 111 is horizontal and perpendicular to the vertical orientation of the module (i.e., toward the north and south in the figure). It is found that this orientation, referred to as an "east-west orientation" according to the planar orientation of the module, typically produces the greatest energy yield. Photovoltaic elements 112, 114, 116 include photosensitive cells on both faces, allowing the module to generate electricity from solar radiation received through either side of the transparent covering 111.

A second bifacial PV module 120 is positioned horizontally with respect to the first bifacial PV module, at a sufficient distance, taking into consideration the height of the modules, to avoid mutual shading effects, and thus for solar radiation to reach the bottom of each module. Second bifacial PV module 120 also includes a planar transparent covering 121 and a plurality of photovoltaic elements 122, 124, 126 arranged along the module. Photovoltaic elements 122, 124, 126 include photovoltaic cells on both south and north-facing sides and can also generate electrical current based on radiation received through either south or north-facing sides of covering 121.

A macro-textured structure 130 is positioned between the bifacial PV modules 110, 120. Macro-textured structure 130 can be configured as a textured matting that extends across all or most of the horizontal distance between the modules 110, 120 and also extends in a perpendicular direction (into the page) corresponding to the depth of the modules. In some embodiments, the macro-textured structure 130 can be conveniently installed in the system as a single unit on a supporting structure between the bifacial PV modules (not shown in the figure) in the manner of laying down a matting or tarp. It is preferable for the macro-textured structure 130 to be positioned at a lower level than all or a substantial majority of the photovoltaic elements of the bifacial modules.

Macro-textured structure 130 is "textured" with a plurality protruding features e.g., 132, 134, 136, 138. The protruding features e.g., 132, 134, 136, 138 can be formed in a regular, periodic sequence as shown, or can include irregularities or varying periodicity. Additionally, while FIG. 1 shows eight protruding features in total, macro-textured structures according to the present invention can include fewer or a greater number of protruding features. The length of the features (L) can vary with a preferable range of about 2.0 mm to about 0.4000 m. The macro-textured structure 130 also includes a reflective and/or diffusive coating layer e.g., 133, 135, 137, 139 deposited over and covering the protruding features 132, 134, 136, 138. In the specific embodiment shown in FIG. 1, the protruding features 132, 134, 136, 138 have pyramidal shapes. In other embodiments, the protruding features 132, 134, 136, 138 and reflective layers 133, 135, 137, 139 can have a different shape, or a variety of shapes. The purpose of the protruding features 132, 134, 136, 138 and the reflective layers 133, 135, 137, 139 is to provide a set of surfaces that efficiently reflect, diffuse and scatter incoming vertical radiation at various angles, such that a substantial portion of the incoming vertical radiation is redirected toward the bifacial PV modules 110, 120, and the photovoltaic elements contained therein (reflected radiation is shown in broken arrows in FIG. 1). To ensure that the bifacial PV modules receive as much reflected and/or diffused light as possible, in some implementations the protruding features can have varying height profiles, with protruding features closer to the modules having lower heights in comparison to protruding features near the center between modules. Varying the heights of the modules in this manner ensures that the protruding features themselves do not block light reflected from adjacent structures from reaching the modules.

The substrate of the macro-textured structure 130 is preferably made from relatively inexpensive materials such as lightweight structural plastics. The substrate can be textured to include the protruding features using known techniques such as embossing and lithography. The reflective layers e.g., 133, 135, 137 can be fabricated by depositing one or more layers of reflective and/or diffusive material, such as a metallic or polymeric film onto the underlying textured substrate. The reflective material can be made of aluminum and can be protected with an aluminum oxide layer to prevent degradation due to humidity.

As shown in the cross-sectional of FIG. 1, the protruding features 132, 134, 136, 138 are not completely continuous and there are holes, e.g., 142, 144, 146, 148 positioned in between the features. The holes 142, 144, 146, 148 provide an outlet for any dust or moisture that precipitates on the structure 130 to be drained away and removed from the system.

FIG. 2A is a top view of a section of an embodiment of the macro-textured structure shown in FIG. 1 in which the three-dimensional shape of the protruding features, and the outline of the holes for draining dust and moisture, are clearly depicted. As shown, the section of macro-textured structure 130 includes three rows and three columns of pyramidal-shaped protruding features (the features also include reflective surfaces that are not explicitly identified in FIG. 2A for illustrative purposes). The middle row of macro-textured structure 130 includes pyramidal protruding features 134, 136, 138. The top row includes pyramidal protruding features 154, 156, 158, and the bottom row includes pyramidal protruding features 164, 166, 168. The pyramidal shapes of the protruding features are designed to allow reflected and diffused light to reach both the adjacent bifacial PV modules in an optimal way. For example, the pyramidal features are symmetric and can reflect incoming vertical light toward both bifacial PV modules.

Also shown in FIG. 2A is a first drainage hole 144 positioned between protruding features 134 and 136, and a second drainage hole 146, positioned between protruding features 136 and 138, within the same row. Drainage holes 144, 146 can be elliptically-shaped as shown, or can have other shapes and sizes. For example, instead of a single, large drainage hole between protruding features, embodiments can include a plurality of smaller drainage holes. In addition, as shown in FIG. 2A, drainage holes can positioned between protruding features of different rows. For example, drainage hole 145 is positioned between protruding features 134 and 154, and drainage hole 147 is positioned between protruding features 138 and 168. FIG. 2B is a cross-sectional view taken along line A-A' of FIG. 2A showing the top (triangular) portions of the protruding features 134, 136, 138 with their respective reflective coatings 135, 137, 139 and holes 144, 146 in between.

FIG. 3 is a cross-sectional view of another embodiment of a bifacial PV module system 200 according to the present invention in which the macro-textured structure includes dome-shaped protruding features. As shown, macro-textured structure 230 includes dome-shaped protruding features e.g., 232, 234, 236, 238. The dome-shaped protruding features 232, 234, 236, 238 are covered with respective reflective layers 233, 235, 237, 239 (shown in dotted line). Drainage holes e.g., 344, 346 are positioned between the protruding features to remove dust or moisture from the macro-texture structure. The dome-shaped protruding features tend reflect light at a wider angular range in comparison to pyramidal features, which can be advantageous characteristic for some bifacial module systems.

FIG. 4A is a top view of a section of an embodiment of the macro-textured structure shown in FIG. 3 in which the three-dimensional shape of the protruding features, and the outline of the holes for draining dust and moisture, are clearly depicted. As shown, the section of macro-textured structure 230 includes three rows and three columns of dome-shaped protruding features. The middle row of macro-textured structure 230 includes dome-shaped protruding features 234, 236, 238. The top row includes dome-shaped protruding features 254, 256, 258, and the bottom row includes dome-shaped protruding features 264, 266, 268. A first drainage hole 244 positioned between protruding features 234 and 236, and a second drainage hole 246, positioned between protruding features 236 and 238, within the same row of features. In addition, drainage hole 245 is positioned between protruding features 234 and 254, and drainage hole 247 is positioned between protruding features 238 and 268. FIG. 4B is a cross-sectional view taken along line B-B' of FIG. 4A showing the top portions of the protruding features 234, 236, 238 with their respective reflective coatings 235, 237, 239 (shown in dotted line) and holes 244, 246 in between the features.

FIG. 5 is view of another embodiment of a bifacial PV module system 300 according to the present invention in which the macro-textured structure 330 includes protruding features of different shapes. In the example depicted, macro-textured structure 330 includes dome-shaped features 331, 332, 333, 334, 335 and pyramidal-shaped features 336, 337. Using protruding features of a variety of shapes enables different reflection profiles to be set according to configuration and conditions of a particular bifacial module system. For example, if the PV modules do not have equal efficiency, and cannot be easily replaced, it can be advantageous to direct more light toward one module than another.

A surface of the textured matting opposite the protruding features can be flat in certain embodiments. In certain embodiments, the matting can be rigid, while in others it can accommodate a degree of flex to support mounting on curved surfaces, if desired. The matting can include a contact adhesive for affixing the macro-textured structure between bifacial PV modules 110, 120, or an adhesive can be applied to its under surface in the field. In certain embodiments, a portion of the drainage holes 142, 144, 146, 148 can be utilized to secure the matting to the structure that supports the bifacial PV modules 110, 120. In other embodiments, the matting can include features that are configured to engage with other structure to affix the matting in place.

It is to be appreciated that the depicted embodiments include pyramidal and dome-shaped protruding features, other shapes can be used. For example other possible shapes include, but are not limited to, parabolic, cone-shaped, and pagoda-shaped. It is preferable for the protruding features to be downward-sloping from a central point to facilitate removal of dust and moisture from the surfaces of the protruding features.

It is to be understood that any structural and functional details disclosed herein are not to be interpreted as limiting the systems and methods, but rather are provided as a representative embodiment and/or arrangement for teaching one skilled in the art one or more ways to implement the methods.

It is to be further understood that like numerals in the drawings represent like elements through the several figures, and that not all components and/or steps described and illustrated with reference to the figures are required for all embodiments or arrangements The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

Terms of orientation are used herein merely for purposes of convention and referencing, and are not to be construed as limiting. However, it is recognized these terms could be used with reference to a viewer. Accordingly, no limitations are implied or to be inferred.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

While the invention has been described with reference to exemplary embodiments, it will be understood by those skilled in the art that various changes may be made and equivalents may be substituted for elements thereof without departing from the scope of the invention. In addition, many modifications will be appreciated by those skilled in the art to adapt a particular instrument, situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A system for generating electricity from solar energy comprising:
   a plurality of adjacent pairs of vertically-oriented photovoltaic modules, each adjacent pair of the plurality including:
   a first vertically-oriented bifacial photovoltaic module;

a second vertically-oriented bifacial photovoltaic module positioned a horizontal distance form the first bifacial photovoltaic module; and a macro-textured structure positioned between the first and second bifacial photovoltaic modules, the macro-textured structure including a plurality of convex protruding features each having respective reflective surfaces that reflect, diffuse and scatter incident solar radiation at various angles toward the first and second bifacial photovoltaic modules, wherein the protruding features are operative to reflect light incoming within a range of 0 to 10 degree of vertical toward the first and second bifacial photovoltaic modules.

2. The system of claim 1, further comprising:

a plurality of drainage holes positioned between adjacent protruding features on the macro-textured surface, the drainage holes adapted to remove dust and moisture from the macro-textured structure.

3. The system of claim 1, wherein each of the plurality of protruding features of the macro-textured structure is covered with a reflective coating layer.

4. The system of claim 1, wherein a portion of the plurality of protruding features is pyramidal in shape.

5. The system of claim 1, wherein a portion of the plurality of protruding features is dome-shaped.

6. The system of claim 1, wherein the plurality of protruding features has a variety of shapes.

7. The system of claim 1, wherein the plurality of protruding features form a regular, periodic pattern on the surface of the macro-textured structure.

8. An apparatus for improving the midday energy yield of a solar energy facility including a series of vertically-oriented bifacial photovoltaic modules, the apparatus comprising:

a macro-textured structure adapted to be positioned between adjacent modules of the series of bifacial photovoltaic modules, the macro-textured structure having surface including a plurality of protruding features having reflective surfaces that are operative to reflect light incoming within a range of 0 to 10 degree of vertical toward the first and second bifacial photovoltaic modules; and a plurality of drainage holes positioned between adjacent protruding features on the macro-textured surface, the drainage holes adapted to remove dust and moisture from the macro-textured structure.

9. The apparatus of claim 8, wherein the plurality of protruding features of the macro-textured structure is covered with a reflective coating layer.

10. The apparatus of claim 8, wherein a portion of the plurality of protruding features is pyramidal in shape.

11. The apparatus of claim 8, wherein a portion of the plurality of protruding features is dome-shaped.

12. The apparatus of claim 8, wherein the plurality of protruding features has a variety of shapes.

13. The apparatus of claim 8, wherein the plurality of protruding features forms a regular, periodic pattern on the surface of the macro-textured structure.

14. The apparatus of claim 8, wherein the plurality of protruding features forms a non-periodic pattern on the surface of the macro-textured structure.

15. The apparatus of claim 8, wherein the plurality of protruding features have varying height profiles, with protruding features near the center of the macro-textured structure having a greater height than protruding features near the periphery of the macro-textured structure.

* * * * *